United States Patent [19]

Koo et al.

[11] 4,081,653

[45] Mar. 28, 1978

[54] REMOVAL OF THIN FILMS FROM SUBSTRATES BY LASER INDUCED EXPLOSION

[75] Inventors: Jackson Chik-Yun Koo, Sau Paulo, Brazil; Vincent Joseph Zaleckas, Union, N.J.

[73] Assignee: Western Electric Co., Inc., New York, N.Y.

[21] Appl. No.: 754,293

[22] Filed: Dec. 27, 1976

[51] Int. Cl.² ........................ B23K 26/00; B05D 3/06
[52] U.S. Cl. ............................ 219/121 LM; 427/53; 427/96; 427/271; 427/272; 427/444
[58] Field of Search ............. 219/68, 121 LM, 121 L, 219/121 EM; 346/1, 76 L, 135; 427/53, 96, 271, 272, 444, 146; 101/401.1, 467, 471; 358/297; 96/27 R, 27 E

[56] References Cited

U.S. PATENT DOCUMENTS

| | | | |
|---|---|---|---|
| 3,410,979 | 11/1968 | Larsson | 219/68 |
| 3,596,045 | 7/1971 | Steigerwald et al. | 219/121 LM X |
| 3,655,379 | 4/1972 | Gundlach | 96/27 R |
| 3,665,483 | 5/1972 | Becker et al. | 346/1 |
| 3,787,210 | 1/1974 | Roberts | 96/27 E |
| 3,969,604 | 7/1976 | Baardsen | 219/121 LM |

*Primary Examiner*—Harry J. Gwinnell
*Attorney, Agent, or Firm*—D. J. Kirk

[57] ABSTRACT

Selected portions of a thin film coating of metal are removed from an insulative substrate by directing a coherent beam of light energy from a laser at the coating, to heat the coating and cause the evaporation and entrapment of the substrate material at the coating-substrate interface. A positive pressure builds up at the interface resulting in an explosion which removes the coating material.

10 Claims, 4 Drawing Figures

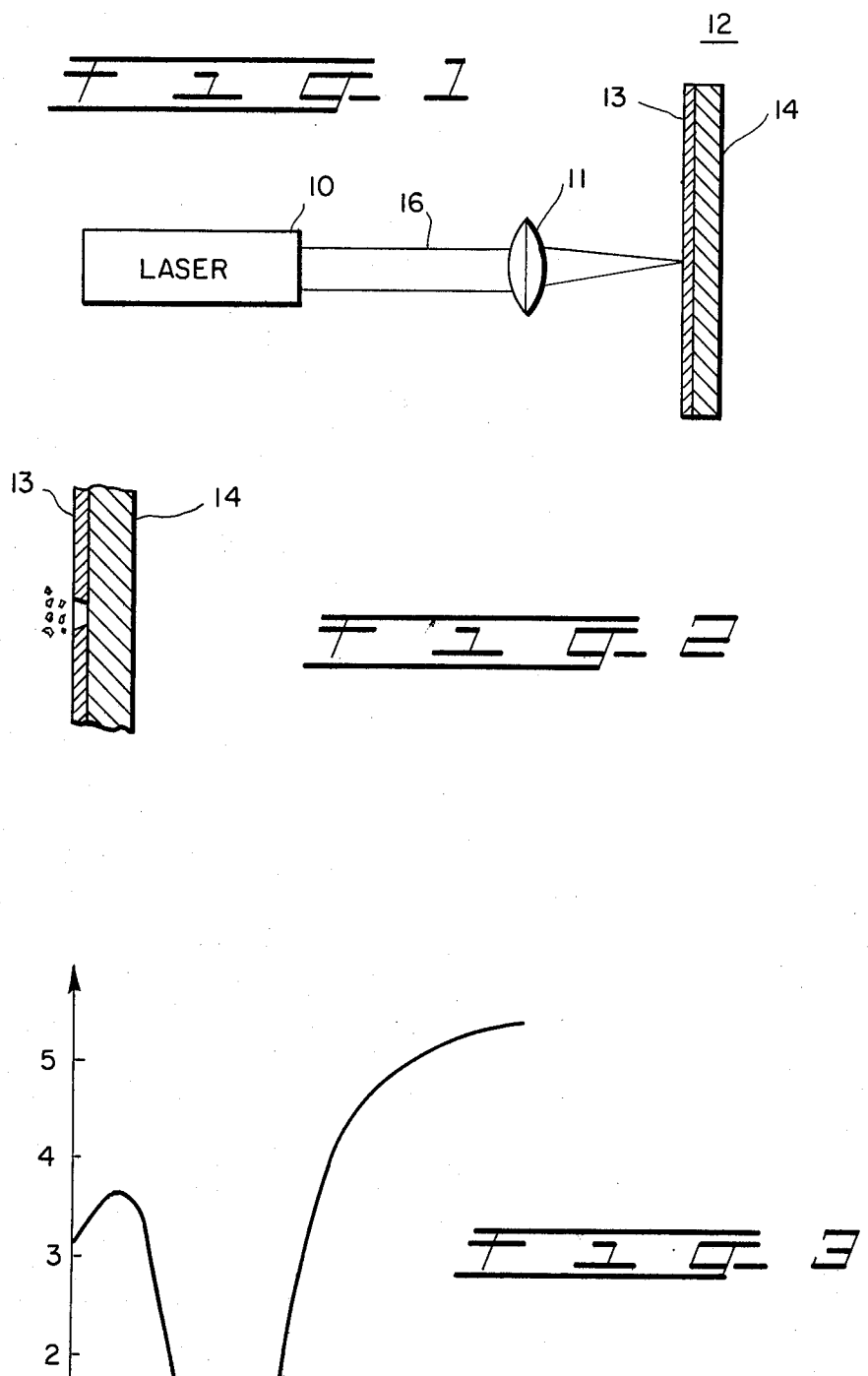

REMOVAL OF THIN FILMS FROM SUBSTRATES BY LASER INDUCED EXPLOSION

BACKGROUND OF THE INVENTION

1. Field of the Invention

The instant invention is directed to laser machining of metallized substrates. In particular, thin metallized coatings are selectively removed by means of a laser induced explosion.

2. Description of the Prior Art

Additive type processes are known for forming circuit patterns on printed wiring boards wherein a thin film of metal is deposited on the full surface of a substrate and then selectively removed to form the desired pattern. The remaining thin metal film provides a conductive base for depositing additional metal thereon to form a good electrical conductor.

The selective removal step may be accomplished by masking portions of the metallic film with photoresist and chemically etching away the unwanted metallic film. However, it is economically desirable to eliminate these photoresist coating and chemical etching steps.

It is well known to use a coherent beam of light energy from a laser to selectively remove the metallized film from insulative substrates, for example, see U.S. Pat. 3,911,444 to Lou et al. which issued on Oct. 7, 1975. The laser beam scans the metallized substrate and is modulated to directly vaporize predetermined portions of the metallic coating. The remaining metal defines an electrical connecting pattern for printed wiring boards or the like.

With such direct vaporization, the minimum optical energy required for the removal of a particular metallic film, i.e., the threshold value for laser machining, is dependent not only upon the optical properties but also on the thermal properties such as the evaporation temperature and the latent heat of vaporization of the metallic film. Due to the extremely high vaporization temperatures of metals such as copper and gold, which usually form the metallic films, a direct vaporization mechanism requires relatively high laser machining thresholds which undesirably damage heat-sensitive substrates.

Accordingly, the use of a laser to remove thin metallic films from dielectric substrates has not found favor, for the laser evaporation of the metallic films requires substantial laser power and results in unacceptable damage to the substrate.

SUMMARY OF THE INVENTION

Applicants have overcome the foregoing problem with a method for the removal of portions of a thin metallic film coating from a substrate having a vaporization temperature which is lower than the melting temperature of the thin film. Selected portions of the thin film coating are heated to a temperature above the vaporization temperature of the substrate material but below the melting temperature of the thin film. The substrate becomes heated and portions of the substrate material at the thin film-substrate interface are vaporized, entrapping the vapors and inducing an explosion which removes the portions of the thin film coating from the substrate.

Advantageously, the instant method can be accomplished using a low cost, low power laser. In addition, the entire coating may be removed from the substrate when desired.

Furthermore, the instant method results in substantially no damage to the substrate material.

Additionally, a finite range of laser power exists over which material removal is achieved with no perceptable substrate damage.

BRIEF DESCRIPTION OF THE DRAWINGS

FIG. 1 is a schematic representation of apparatus used to implement the instant invention;

FIG. 2 is a partial, cross-sectional view of a metallized dielectric substrate showing a portion of the metallization being explosively removed;

FIG. 3 is a curve depicting the laser machining threshold as a function of copper film thickness.

DETAILED DESCRIPTION

Figure 4:
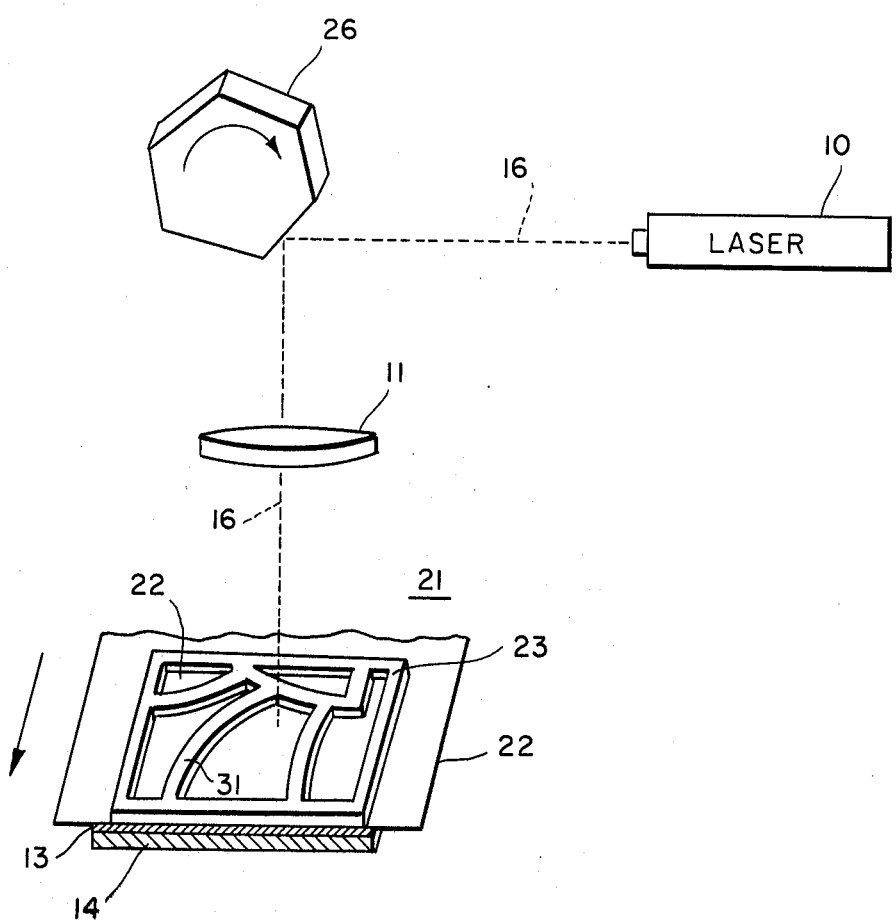
FIG. 4 is an exemplary embodiment of the instant invention used to form circuit patterns on a printed circuit board.

In recent years lasers have been extensively used as micromachining tools for the removal of metallic films deposited on dielectric substrates. The basic mechanism considered in these machining processes, however, was confined to the direct vaporization of the metallic films through optical radiation heating. Under such conditions, the minimum optical energy required for the removal of a particular metallic film, i.e., the threshold value for laser machining, is dependent not only upon the optical properties such as reflectivity and absorptivity, but also on the thermal properties such as the evaporation temperature and the latent heat of evaporation of the metallic film. For some industrial applications, such as the direct generation of electrical conductor patterns on dielectric substrates, films such as copper or gold are typically used. However, because of the extremely high evaporation temperatures of these films, a direct vaporization mechanism requires relatively large laser machining thresholds which damage heat-sensitive substrates.

Applicants have discovered a film removal method which precludes the foregoing problems. In particular, applicants have found that for film thicknesses less than a few thousand angstroms, laser machining thresholds significantly less than that predicted by a direct vaporization process are obtainable.

In applicants' method, the temperature of the thin metallic film and that of the underlying dielectric substrate will rise due to the absorption of the incident laser radiation focused on the film. If the vaporization temperature (or, alternatively, the decomposition temperature, the de-gas temperature or the vaporization temperature of any liquid remaining in the substrate) of the dielectric substrate is lower than the melting temperature of the thin film, a positive pressure develops between the substrate and the film causing an explosive removal of that portion of the metallic thin film.

FIG. 1 depicts the apparatus used to implement the instant method. A laser 10 which provides a source of coherent light energy and focusing optics 11 are shown. A metallized substrate, generally designated by the numeral 12, comprised of a thin metal coating 13 on a dielectric substrate 14, is spaced from the laser 10 and the optics 11. The thin metallic coating 13 has a melting temperature which is higher than the vaporization temperature of the dielectric substrate 14.

In operation, a beam 16 of light energy from the laser 10 is focused by the optics 11 onto the thin metallic coating 13 which is heated to a temperature that is below the melting point of the coating but above the vaporization temperature of the material forming a part of the dielectric substrate 14. The portions of the substrate 14 so heated will vaporize, causing a pressure buildup at the thin film 13-substrate 14 interface which is sufficient to explosively remove portions of the film from the substrate, as shown in FIG. 2. If desired, the entire thin film coating 13 may be removed from the substrate 14.

In a particular embodiment, the laser 10 was a Q-switched Nd:YAG laser having an effective wavelength of 1.06μm which was directed to an approximately 0.002 inch diameter spot on the metal coating 13. Other lasers, both pulsed and continuous, for example: $CO_2$, argon, etc. may be used. The only requirement being that the laser have sufficient power to cause vaporization of the substrate material.

The thin metal coating 13 was copper having a thickness of approximately 250 angstroms which was deposited electrolessly on the substrate 14 which was a flexible glass reinforced epoxy approximately. 0.040 inches thick. The melting temperature of the copper coating 13 was 1,083° C. and the vaporization temperature of the glass reinforced epoxy substrate 14 was 200° C.

The instant laser induced explosion machining method and a conventional chemical etching process using ammonium persulfate were compared by applying both processes to different sections of the same metallized substrate. The comparison of the substrate surface with high resolution Scanning Electron Microscope photography revealed no difference.

Although applicants' method of removing the thin metal coating 13 from a dielectric substrate 14 is effective for removing a wide range of coating thicknesses where substrate damage is not a concern, they have discovered a range of metal coating thicknesses between 200 and 500 angstroms which can be advantageously removed without visible substrate damage. Damage to the substrate 14 has been identified where the thickness of the metal coating 13 exceeds 100,000 angstroms. Below this limit and for as long as the metal coating 13 has sufficient thickness (or internal binding energy) to allow for a pressure buildup an explosive removal of the coating occurs when the evaporation or de-gas temperature of the substrate 14 is reached.

However, when the coating 13 becomes too thin to support the internal pressure buildup, a premature localized pressure release can occur which reduces the effectiveness of the explosive removal process. For the copper-epoxy system referred to above, this lower limit was found to occur below a copper film thickness of 200 angstroms.

Applicants have discovered an optimum copper film thickness which requires an unexpectedly low laser machining threshold. FIG. 3 is a curve which depicts the relationship of the power threshold required for laser machining of different film thicknesses of copper. It can be clearly seen from the curve that the laser power falls to approximately $0.25 \times 10^6$ watts/cm$^2$ when the film thickness is on the order of 300 angstroms. Accordingly, laser machining of metallized substrates having such an optimum metallic coating thickness advantageously permits the use of a low power laser and results in no discernable damage to the substrate.

A further exemplary embodiment using the instant inventive method to form conductive patterns on a printed wiring board is depicted in FIG. 4. A sandwich arrangement, generally designated by the numeral 21, is formed by placing a transparent film 22 proximate, or in intimate contact with, the substrate 14 which has a thin metal coating 13 as hereinbefore described. The film 22 used was a polyester film approximately one thousandth of an inch thick sold under the trade-mark Mylar which is registered to the E. I. DuPont de Nemours and Company. A patterned metal mask 23 is placed on film 22 and aligned with the metallized substrate 14. The laser 10 and the focusing optics 11 are substantially the same as hereinbefore described with the addition of a multi-faceted rotatable mirror 26 interposed therebetween.

The mask 23 is fabricated by evaporating a metal film of copper on a polyester substrate such as Mylar. An evaporated thickness of copper of at least 5000 angstroms is required so as to preclude damage to the mask 23 during laser machining of the metallized substrate 12. The mask 23 may be mounted on a rigid clear plate (not shown) to provide support and rigidity.

In operation, the laser 10 generates the beam 16 which is directed towards, and reflected from, the rotating mirror 26 through the focusing optics towards the sandwich arrangement 21. As the mirror 26 rotates, the beam 16 moves laterally to scan the width of the sandwich 21 as the sandwich is moving in a longitudinal direction, resulting in a raster scanning of the full surface of the sandwich. As the beam 16 traverses the mask 23, the metal portions 31 thereof will prevent the beam from impinging on and heating the coating 13. When the beam moves from the metal portions 31, it is focused on the coating 13 which is heated to a temperature of approximately 200° C. which is below the melting point of the coating but is sufficient to cause evaporation of portions of the substrate 14 therebelow. The entrapped vapor at the interface creates a positive pressure sufficient to explode or blow the coating 13 from that portion of the substrate 14. The metal debris from the explosive removal is projected onto the film 22. The mask 23 and the film 22 are then removed leaving the substrate 14 with the desired metallized pattern thereon. Advantageously, the removal of the debris by the film 22 precludes the redepositing of the metal on the substrate which would lower the resistance thereof and result in the buildup of metal outside the desired pattern during "plating up" of the circuit pattern.

The film 22 with the explosive debris from the removed portion of the thin film coating 13 thereon may be removed and discarded or reprocessed to recover the removed coating material.

Although the instant invention has been described in terms of metallized insulative substrate, it should not be so limited. The substrate 14 or the coating 13 could be any number of materials as long as the melting point of the coating is higher than the vaporization temperature of the substrate material. For example, it is contemplated that a thin metal coating 13 on a metallic substrate 14 would fall within the purview of the instant invention as long as the vaporization temperature of the metallic substrate 14 is less than the melting temperature of the the metal coating. Such a metal-on-metal coating could be used where upraised metal portions are to be formed on a metal substrate for purposes of printing, ornamental designs, or the like.

Additionally, the instant invention has been implemented using laser energy but should not be so limited. Any energy source which can be focused on the metallic coating to heat the coating and evaporate portions of the substrate material thereunder may be used.

What is claimed is:

1. A method for the removal of a metallic thin film coating from a substrate, comprising the steps of:
   directing a beam of radiant energy to heat the thin film coating to a temperature below the melting temperature of the coating material and above the vaporization temperature of the substrate to heat and cause vaporization of the substrate at the thin film-substrate interface; and
   entrapping the vapors at said interface to induce an explosion to remove the thin film coating from the substrate.

2. The method as set forth in claim 1, wherein:
   the beam of radiant energy is a laser beam.

3. The method as set forth in claim 1, wherein:
   the thin film coating is copper and has a thickness between 200 and 500 angstroms and has a melting temperature of 1,083° C.

4. The method as set forth in claim 3, wherein the substrate has a vaporization temperature of 200° C.

5. A method of selectively removing portions of a metallic thin film coating from a substrate, comprising the steps of:
   placing an apertured, heat resistant mask on the coated substrate;
   raster scanning the masked, coated substrate with a coherent laser beam focused at the thin film coating to heat portions of the coating which are exposed through the apertures to a temperature below the melting temperature of the coating material and above the vaporization temperature of the substrate at the thin film-substrate interface; and
   entrapping the vapors at said interface to induce an explosion to remove the selected portions of the thin film coating from the substrate.

6. The method of selectively removing portions of a thin film coating from a substrate as set forth in claim 5, which further comprises:
   interposing a transparent film between the apertured heat resistant mask and the thin film coating.

7. The method as set forth in claim 5, wherein the thin film coating is copper and has a thickness between 200 and 500 angstroms and has a melting temperature of 1,083° C.

8. The method as set forth in claim 7, wherein the substrate has a vaporization temperature of 200° C.

9. A method of fabricating a printed circuit board by selectively removing portions of a metallic thin film coating from an insulative substrate, comprising the steps of:
   (a) placing a transparent film over the metallic thin film coating;
   (b) further placing a metallic, apertured heat resistant mask on the tranparent film;
   (c) raster scanning the mask with a coherent laser beam focused at the metallic thin film coating to heat portions of the coating, which are exposed through the apertures, to a temperature below the melting temperature of the metallic thin film coating and above the vaporization temperature of the dielectric substrate at the metallic thin film-insulative substrate interface; and
   (d) entrapping the vapors of the substrate at said interface to induce an explosion to remove the selected portions of the metallic thin film coating from the insulative substrate.

10. The method of fabricating a printed circuit board as set forth in claim 9, wherein:
    the metallic thin film is copper having a thickness between 200 and 500 angstroms and has a melting temperature of 1,083° C; and
    the insulative substrate has a vaporization temperature of 200° C.

* * * * *